US008872548B2

(12) United States Patent
Liu et al.

(10) Patent No.: US 8,872,548 B2
(45) Date of Patent: Oct. 28, 2014

(54) METHOD AND APPARATUS FOR CALIBRATING LOW FREQUENCY CLOCK

(71) Applicant: Huawei Technologies Co., Ltd., Shenzhen (CN)

(72) Inventors: Dongsheng Liu, Shanghai (CN); Yu Liu, Shanghai (CN)

(73) Assignee: Huawei Technologies Co., Ltd., Shenzhen (CN)

(*) Notice: Subject to any disclaimer, the term of this patent is extended or adjusted under 35 U.S.C. 154(b) by 0 days.

(21) Appl. No.: 14/034,909

(22) Filed: Sep. 24, 2013

(65) Prior Publication Data
US 2014/0021997 A1  Jan. 23, 2014

Related U.S. Application Data

(63) Continuation of application No. PCT/CN2011/073290, filed on Apr. 26, 2011.

(51) Int. Cl.
*H03K 9/06* (2006.01)
*H04W 52/02* (2009.01)

(52) U.S. Cl.
CPC ............ *G03K 3/011* (2013.01); *H04W 52/029* (2013.01); *H04W 52/0293* (2013.01)
USPC .................................. 327/48; 327/44; 327/47

(58) Field of Classification Search
USPC .................. 327/39–40, 42, 44–45, 47–48
See application file for complete search history.

(56) References Cited

U.S. PATENT DOCUMENTS

| 6,597,205 B2 * | 7/2003 | Powell et al. ................ 327/48 |
| 7,096,137 B2 * | 8/2006 | Shipton et al. ............. 702/106 |

FOREIGN PATENT DOCUMENTS

| CN | 101079687 A | 11/2007 |
| CN | 101090547 A | 12/2007 |
| CN | 101252720 A | 8/2008 |
| JP | 2010088476 A | 4/2010 |

OTHER PUBLICATIONS

Foreign Communication From A Counterpart Application, PCT Application No. PCT/CN2011/073290, Chinese Search Report dated Mar. 1, 2012, 7 pages.
Foreign Communication From A Counterpart Application, PCT Application No. PCT/CN2011/073290, Chinese Written Opinion dated Mar. 1, 2012, 3 pages.
Foreign Communication From A Counterpart Application, Chinese Application No. 201180000319.9, Chinese Search Report dated Jun. 3, 2013, 5 pages.

* cited by examiner

*Primary Examiner* — An Luu
(74) *Attorney, Agent, or Firm* — Conley Rose, P.C.; Grant Rodolph; Nicholas K. Beaulieu

(57) ABSTRACT

A method and an apparatus for calibrating a low frequency clock are disclosed. The method includes: calculating a frequency of a low frequency clock in a current low frequency clock calibration; and calculating an average value of low frequency clock frequencies in n clock calibrations before the current calibration, where n is greater than 1 and is an integer; judging whether a difference between the frequency of the low frequency clock in the current low frequency clock calibration and the average value is smaller than a preset threshold for the difference; and if the difference between the frequency of the low frequency clock in the current low frequency clock calibration and the average value is smaller than the preset threshold for the difference, calculating the number of sleep cycles according to the calculated and obtained frequency of the low frequency clock in the current low frequency clock calibration.

7 Claims, 4 Drawing Sheets

METHOD AND APPARATUS FOR CALIBRATING LOW FREQUENCY CLOCK

CROSS-REFERENCE TO RELATED APPLICATION

This application is a continuation of International Application No. PCT/CN2011/073290, filed on Apr. 26, 2011, which is hereby incorporated by reference in its entirety.

STATEMENT REGARDING FEDERALLY SPONSORED RESEARCH OR DEVELOPMENT

Not applicable.

REFERENCE TO A MICROFICHE APPENDIX

Not applicable.

TECHNICAL FIELD

The present invention relates to a clock calibration technology, and in particular, to a method and an apparatus for calibrating a low frequency clock.

BACKGROUND

Standby power consumption is one of the main points of competition of mobile terminal products. The standby power consumption depends on a lot of factors, the most critical one of which is dynamic power consumption generated when receiving paging after waking up in a standby process. Main factors affecting wakeup time include warm-up, synchronization, receiving and demodulation, measurement, and low frequency clock calibration. In most solutions, the clock calibration is the most time-consuming factor, and thus becomes one of the major factors affecting the standby power consumption.

Generally, a high frequency clock source of a system is a 26 megahertz (MHz) voltage-controlled temperature compensated crystal oscillator (VCTCXO). This VCTCXO is frequency doubled to a 52 MHz (or other frequencies) high frequency clock source by a phase-lock loop (PLL) inside a wireless baseband chip, and is then used as a system clock. Because the VCTCXO needs to consume 2 milliamps (mA) to 4 mA power, power consumption is high. To reduce the power consumption, a low frequency clock output by a 32.768 K crystal oscillator is generally used in a sleep state of the system to maintain system timing, and this low frequency clock is also called a sleep clock.

Specifically, in a standby mode, a terminal implements a sleep-wakeup process according to a discontinuous reception (DRX) period configured by a network side, the high frequency clock is stopped at the time of sleep to reduce power consumption, and the low frequency clock is used to produce various needed time sequences and perform timing. However, both the high frequency clock and the low frequency clock have frequency deviations due to physical characteristics of the clock. The frequency deviation of the high frequency clock is kept within the range of 0.1 parts per million (ppm) through an automatic frequency calibration. The low frequency clock has poor frequency stability because it is generated by the crystal oscillator, and the frequency deviation generally ranges from 30 ppm to 50 ppm in the total temperature range.

Therefore, at the beginning of each DRX period, the low frequency clock needs to be calibrated first, and the number of sleep cycles of the low frequency clock is calculated and obtained when the terminal is in the sleep state. In this way, the terminal may execute the sleep-wakeup process after the low frequency clock experiences several sleep cycles, and perform signal reception at the network side. The terminal can enter a real sleep state only after the number of sleep cycles is calculated and obtained. Therefore, through the foregoing low frequency clock calibration, failure of reception of network signals by the terminal is prevented when the frequency deviation of the low frequency clock exceeds a maximum frequency deviation allowed by the system. In the prior art, an implementation method for calibrating a low frequency clock is generally: determining the number M of high frequency clock cycles corresponding to preset N low frequency clock cycles; calculating a ratio of N to M and obtaining a frequency of a low frequency clock; calculating the number of sleep cycles according to the frequency of the low frequency clock, and calibrating the low frequency clock. The system can enter the real sleep state only after the calibration is completed.

In the foregoing clock calibration method, in the case that the clock stability has no error, an error of 0 to 2 high frequency clock cycles may still occur in a calibration process because the low frequency clock is not synchronized with the high frequency clock. As shown in FIG. 1, an error may occur in a calibration process according to the foregoing figure. To reduce the impact of the error in the prior art, calibration time needs to be prolonged, that is, the real sleep time of the system needs to be reduced and thus the power consumption of the system is increased. In addition, the calibration method cannot predict the frequency deviation of the low frequency clock, where the frequency deviation of the low frequency clock is caused by temperature change when the terminal enters the sleep state after the calibration is completed. For example, if the temperature changes greatly, the frequency deviation of the low frequency clock may exceed the maximum frequency deviation allowed by the system when the terminal enters the sleep state after the clock is calibrated, which may still cause failure of reception of network signals by the terminal.

SUMMARY

A technical problem to be solved in the present invention is to provide a method and an apparatus for calibrating a low frequency clock, which can reduce calibration time of a low frequency clock and reduce failure of reception of network signals by a terminal.

Embodiments of the present invention adopt the following technical solutions:

An embodiment of the present invention provides a method for calibrating a low frequency clock, where the method includes: calculating a frequency of a low frequency clock in a current low frequency clock calibration; and calculating an average value of low frequency clock frequencies in n clock calibrations before the current low frequency clock calibration, where n is greater than 1 and is an integer; and judging whether a difference between the frequency of the low frequency clock in the current low frequency clock calibration and the average value is smaller than a preset threshold for the difference; and if the difference between the frequency of the low frequency clock in the current low frequency clock calibration and the average value is smaller than the preset threshold for the difference, calculating the number of sleep cycles according to the calculated and obtained frequency of the low frequency clock in the current low frequency clock calibration.

An embodiment of the present invention provides an apparatus for calibrating a low frequency clock, where the apparatus includes: a first calculating unit configured to: calculate a frequency of a low frequency clock in a current low frequency clock calibration; and calculate an average value of low frequency clock frequencies in n clock calibrations before the current low frequency clock calibration, where n is greater than 1 and is an integer; a judging unit configured to judge whether a difference between the frequency of the low frequency clock in the current low frequency clock calibration and the average value is smaller than a preset threshold for the difference; and a second calculating unit configured to calculate the number of sleep cycles according to the calculated and obtained frequency of the low frequency clock in the current low frequency clock calibration when the difference between the frequency of the low frequency clock in the current low frequency clock calibration and the average value is smaller than the preset threshold for the difference.

Technical effects of the foregoing technical solutions are analyzed as follows:

Each time when a clock calibration is performed, besides calculating the frequency of the low frequency clock in the current low frequency clock calibration, it is also determined that the difference between the frequency of the low frequency clock in the current low frequency clock calibration and the average value of the low frequency clock frequencies in preset n clock calibrations is smaller than the threshold for the difference. In this way, calibration errors caused by asynchronization between a low frequency clock and a high frequency clock may be reduced. In addition, it may be ensured that when a system enters a sleep state after the clock is calibrated, a frequency deviation of the low frequency clock, where the frequency deviation of the low frequency clock is caused by temperature change, does not exceed a maximum frequency deviation allowed by the system, which prevents the failure of reception of network signals by a terminal.

DETAILED DESCRIPTION

Implementation of a method and an apparatus for calibrating a low frequency clock according to embodiments of the present invention is described in detail with reference to accompanying drawings below.

Figure 1:
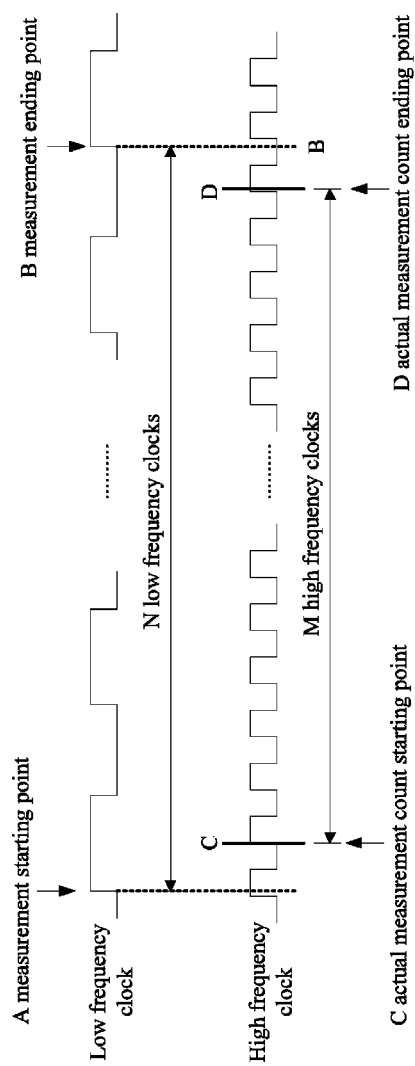
FIG. 1 is a schematic diagram of a measurement deviation caused by asynchronization between a sleep clock and a system clock in the prior art.
Figure 2:
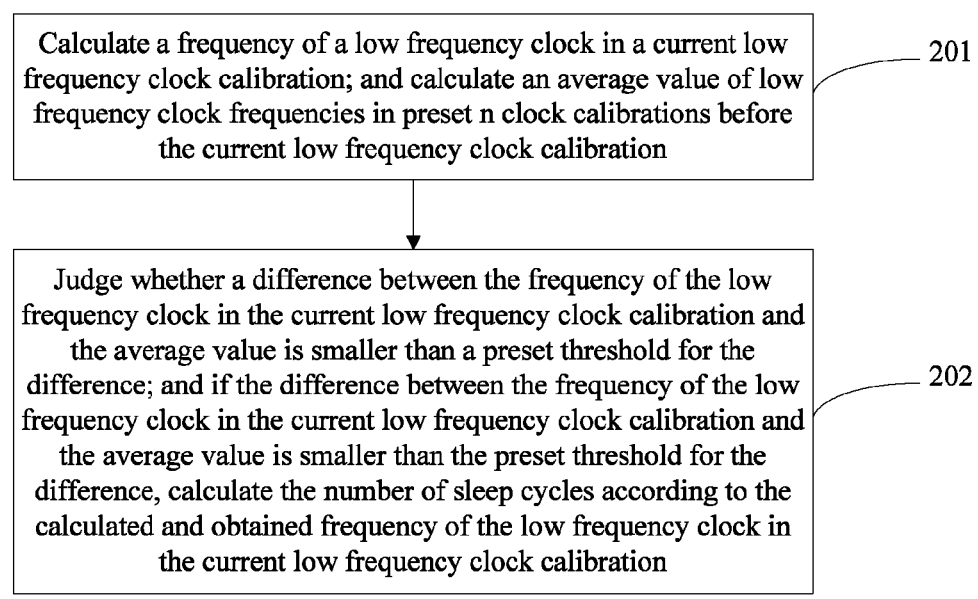
FIG. 2 is a schematic flowchart of a method for calibrating a low frequency clock according to an embodiment of the present invention.

FIG. 2 is a schematic flowchart of a method for calibrating a low frequency clock according to an embodiment of the present invention. As shown in FIG. 2, the method includes:

Step 201: Calculate a frequency of a low frequency clock in a current low frequency clock calibration; and calculate an average value of low frequency clock frequencies in preset n clock calibrations before the current low frequency clock calibration, where n is greater than 1 and is an integer.

Step 202: Judge whether a difference between the frequency of the low frequency clock in the current low frequency clock calibration and the average value is smaller than a preset threshold for the difference; and if the difference between the frequency of the low frequency clock in the current low frequency clock calibration and the average value is smaller than the preset threshold for the difference, calculate the number of sleep cycles according to the calculated and obtained frequency of the low frequency clock in the current low frequency clock calibration.

Frequency stability of a crystal oscillator may be affected by environmental factors such as temperature and crystal aging. The crystal aging speed is +/−3 ppm per year, so the impact of the aging on the frequency stability may be ignored within a DRX period. The temperature is the most important factor that affects the frequency stability of the crystal in a standby process of a terminal. Temperature change is a gradually-changing process, so it may be considered that frequency deviation change of the low frequency clock has a same changing trend within two consecutive DRX periods. In this embodiment of the present invention, a gradually-changing feature of the frequency deviation of the crystal is used to predict, according to a current frequency changing condition of the crystal oscillator, whether a frequency deviation generated by the crystal oscillator with the temperature change can always meet requirements when the terminal enters a sleep state after the current clock calibration. Specifically, the difference between the frequency of the low frequency clock in the current low frequency clock calibration and the average value of the low frequency clock frequencies in the preset n clock calibrations before the current low frequency clock calibration is calculated to quantize the frequency variation generated by the crystal oscillator due to the temperature change; the difference is compared with a preset threshold for the difference; if the difference is smaller than the threshold for the difference, it indicates that the frequency deviation of the low frequency clock, where the frequency deviation of the low frequency clock is caused by the temperature change, does not exceed a maximum frequency deviation allowed by a system when the terminal enters the sleep state after the current low frequency clock calibration. In this way, failure of reception of network signals may be avoided.

In the method for calibrating a low frequency clock as shown in FIG. 2, besides calculating the frequency of the low frequency clock in the current DRX period, it is also determined that the difference between the frequency of the low frequency clock in the current DRX period and the average value of the low frequency clock frequencies in the preset n clock calibrations is smaller than the threshold for the difference. In this way, calibration errors caused by asynchronization between the low frequency clock and a high frequency clock may be reduced. In addition, it may be predicted that the frequency deviation of the low frequency clock, where the frequency deviation of the low frequency clock is caused by the temperature change, does not exceed the maximum frequency deviation allowed by the system when the system enters the sleep state. In this way, the failure of reception of network signals by a terminal can be avoided.

Figure 3:
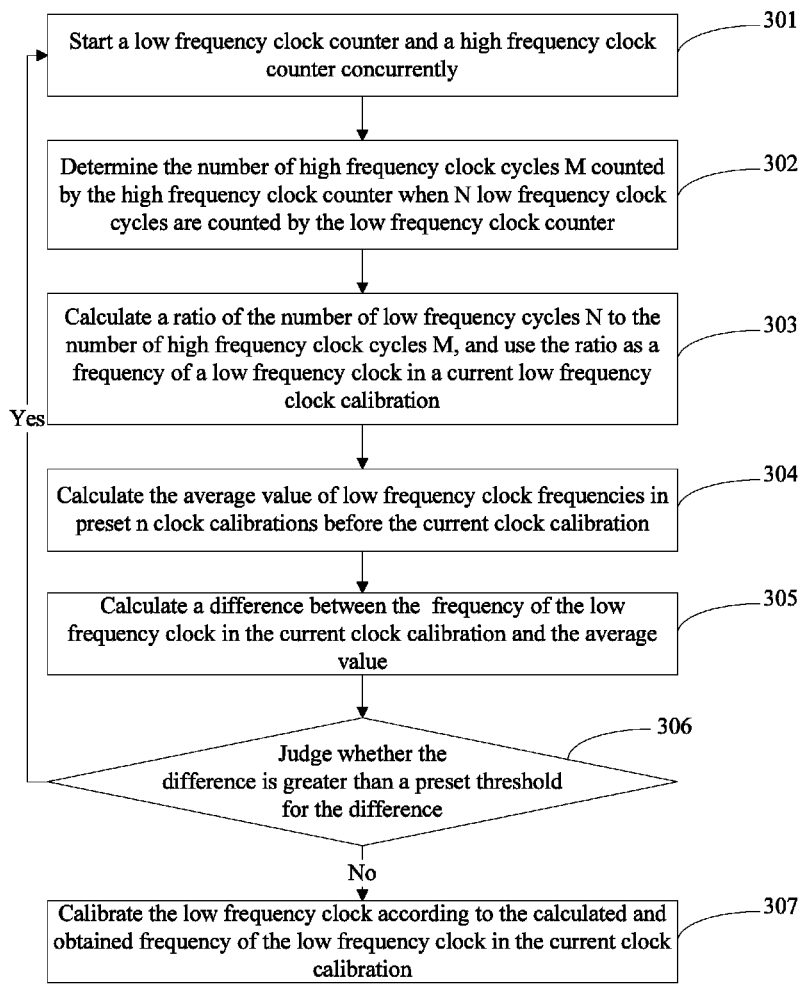
FIG. 3 is a schematic flowchart of another method for calibrating a low frequency clock according to an embodiment of the present invention.

On the basis of FIG. 2, the method for calibrating a low frequency clock according to the embodiment of the present invention is described in more detail with reference to FIG. 3. As shown in FIG. 3, when it is determined that a DRX period arrives, the method for calibrating a low frequency clock according to the present invention includes the following steps:

Step 301: Start a low frequency clock counter and a high frequency clock counter concurrently.

Step 302: When it is determined that the low frequency clock counter counts N low frequency clock cycles, the number of high frequency clock cycles counted by the high frequency clock counter is M, where N and M are integers greater than 1.

Step 303: Calculate a ratio of the number of low frequency clock cycles N to the number of high frequency clock cycles M, and use the ratio as a frequency of a low frequency clock in a current low frequency clock calibration.

The frequency of the low frequency clock is also the number of high frequency clock cycles corresponding to a low frequency clock cycle.

Step 304: Calculate an average value of low frequency clock frequencies in preset n clock calibrations before the current clock calibration, where n is greater than 1 and is an integer.

Step 305: Calculate a difference between the frequency of the low frequency clock in the current clock calibration and the average value.

Step 306: Judge whether the difference is greater than a preset threshold for the difference; if the difference is greater than a preset threshold for the difference, return to step 301, and start the high frequency clock counter and the low frequency clock counter to perform re-counting and re-calculation; if the difference is not greater than a preset threshold for the difference, proceed to step 307.

Step 307: Calculate the number of sleep cycles according to the calculated and obtained frequency of the low frequency clock in the current clock calibration.

In this step, the number of sleep cycles is generally calculated and obtained according to a preset sleep state duration of the terminal and the frequency of the low frequency clock. In this way, the terminal may execute a sleep-wakeup process after the low frequency clock experiences the several cycles, and receive a signal sent by a network side, so that failure of reception of network signals by the terminal does not occur.

Through the foregoing steps, the clock calibration is completed. After the clock calibration is completed, the terminal may enter the sleep state. At this time, the high frequency clock and the baseband chip do not work, and the low frequency clock produces a time sequence and performs timing.

In step 305, the difference between the frequency of the low frequency clock in the current clock calibration and the average value of low frequency clock frequencies in n clock calibrations before the current clock calibration is calculated, that is, a variation of the frequency of the low frequency clock under different temperatures is obtained; if the difference is smaller than the preset threshold for the difference $\epsilon_{frequency\ deviation\ threshold\ for\ sleep}$, it may be considered that when the terminal enters the sleep state after the current low frequency clock calibration, the frequency deviation of the low frequency clock changes slowly within the entire sleep time, and the frequency deviation is smaller than the allowable maximum frequency deviation $\epsilon_{allowable\ maximum\ frequency\ deviation}$ of the system, and in this case, the terminal is allowed to enter the sleep state after the clock calibration; if the difference is greater than the threshold for the difference $\epsilon_{frequency\ deviation\ threshold\ for\ sleep}$, it may be considered that the current frequency deviation changes rapidly, and in this case, the terminal is forbidden to enter the sleep state, and the process goes back to step 301, that is, a next low frequency clock calibration is started, and the terminal is not allowed to enter the sleep state until it is determined that the difference is smaller than the preset threshold for the difference $\epsilon_{frequency\ deviation\ threshold\ for\ sleep}$.

The maximum frequency deviation $\epsilon_{allowable\ maximum\ frequency\ deviation}$ refers to the maximum deviation of the frequency of the low frequency clock, where the maximum deviation of the frequency of the low frequency clock is allowed by the system, when the timing error of the low frequency clock is smaller than the system requirement within the DRX period. The maximum frequency deviation may be calculated and obtained according to the allowable timing error and the DRX period.

The threshold for the difference $\epsilon_{frequency\ deviation\ sleep\ threshold}$ is a threshold used to judge whether the current frequency of the low frequency clock varies slowly, and is set by a user. Generally, the threshold for the difference $\epsilon_{frequency\ deviation\ threshold\ for\ sleep}$ is smaller than the maximum frequency deviation $\epsilon_{allowable\ maximum\ frequency\ deviation}$. Preferably, the threshold for the difference may be equal to about 70% of the allowable maximum frequency deviation, that is, about 70% of the $\epsilon_{allowable\ maximum\ frequency\ deviation}$.

Figure 4:
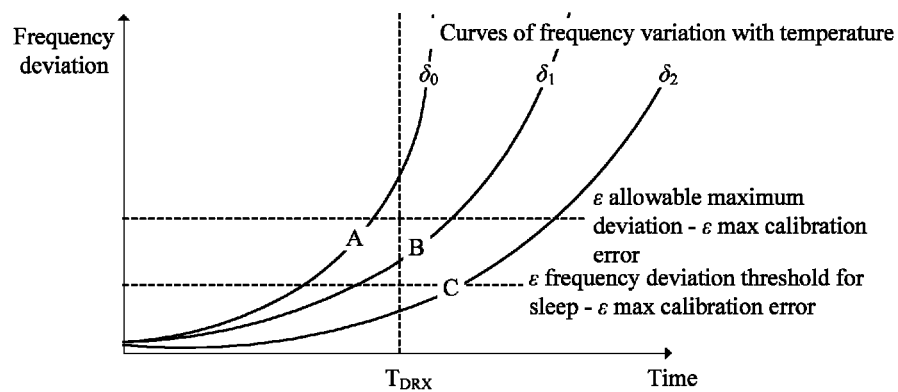
FIG. 4 is a schematic diagram of frequency variation curves of a low frequency clock under different temperature change rates according to an embodiment of the present invention.

As shown in FIG. 4, curves A, B, and C in the figure correspond to frequency variation curves of a low frequency clock under different temperature change rates $\delta_0$, $\delta_1$, and $\delta_2$ (where $\delta_0 > \delta_1 > \delta_2$) respectively. With same timing time and $\Delta T_{temperature\ difference}$, the larger a temperature change rate is, the larger a frequency deviation of the low frequency clock is.

If the maximum sleep time of a communication system is $T_{DRX}$ and the temperature of the curve A within $T_{DRX}$ causes the frequency deviation to be greater than a difference between $\epsilon_{allowable\ maximum\ frequency\ deviation}$ and $\epsilon_{max\ calibration\ error}$, the synchronization may fail after the wakeup and it is necessary to search for a cell again. $\epsilon_{max\ calibration\ error}$ refers to a calibration error caused by the misalignment between a high frequency clock and the low frequency clock.

The temperature of the curve B within $T_{DRX}$ causes the frequency deviation to be smaller than the difference between $\epsilon_{allowable\ maximum\ frequency\ deviation}$ and $\epsilon_{max\ calibration\ error}$, so the synchronization can be performed normally after the wakeup. However, the frequency deviation is greater than a difference between $\epsilon_{frequency\ deviation\ threshold}$ for sleep and $\epsilon_{max\ calibration\ error}$, which indicates that the temperature changes greatly in a previous DRX sleep process, and that a large frequency deviation may occur in a current DRX sleep cycle. At this time, a terminal is forbidden to enter a sleep state, and a clock calibration process is restarted to wait for the temperature to change slightly.

The temperature of the curve C within $T_{DRX}$ causes the frequency deviation to be smaller than the difference between $\epsilon_{frequency\ deviation\ threshold\ for\ sleep}$ and $\epsilon_{max\ calibration\ error}$, which indicates that the temperature changes slightly in a previous DRX period. Because the temperature change trend is relatively slow, it is considered that the terminal can enter the sleep state within the current DRX period according to the current temperature change trend.

Figure 5:
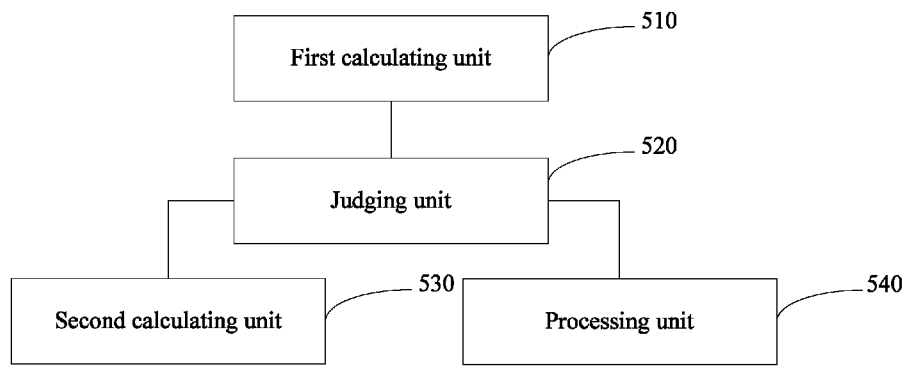
FIG. 5 is a schematic structural diagram of an apparatus for calibrating a low frequency clock according to an embodiment of the present invention.

Corresponding to the method for calibrating a low frequency clock according to the embodiment of the present invention, an embodiment of the present invention also provides an apparatus for calibrating a low frequency clock. As shown in FIG. 5, the apparatus includes: a first calculating unit 510 configured to: calculate a frequency of a low frequency clock in a current low frequency clock calibration; and calculate an average value of low frequency clock frequencies in preset n clock calibrations before the current low frequency clock calibration, where n is greater than 1 and is an integer; a judging unit 520 configured to judge whether a difference between the frequency of the low frequency clock in the current low frequency clock calibration and the average value is smaller than a preset threshold for the difference; and a second calculating unit 530 configured to calculate the number of sleep cycles according to the calculated and obtained frequency of the low frequency clock in the current low frequency clock calibration when the difference between the frequency of the low frequency clock in the current low frequency clock calibration and the average value is smaller than the preset threshold for the difference.

Preferably, as shown in FIG. 5, the apparatus may further include: a processing unit 540 configured to control the calculating units to restart a low frequency clock calibration when it is judged that the difference between the frequency of the low frequency clock in the current low frequency clock calibration and the average value is not smaller than the preset threshold for the difference.

Preferably, the first calculating unit 510 may include: a starting subunit configured to start a low frequency clock counter and a high frequency clock counter; a determining subunit configured to determine the number M of high frequency clock cycles corresponding to preset N low frequency clock cycles; a first calculating subunit configured to: calculate a ratio of the number of low frequency cycles N to the number of high frequency clock cycles M, and use the ratio as the frequency of the low frequency clock in the current low frequency clock calibration, where N and M are integers greater than 1; and a second calculating subunit configured to calculate the average value of low frequency clock frequencies in preset n clock calibrations before the current low frequency clock calibration, where n is greater than 1 and is an integer.

In the apparatus for calibrating a low frequency clock as shown in FIG. 5, each time when a clock calibration is performed, besides calculating the frequency of the low frequency clock in the current low frequency clock calibration, it is also determined that the difference between the frequency of the low frequency clock in the current low frequency clock calibration and the average value of the low frequency clock frequencies in the preset n clock calibrations is smaller than a threshold for the difference. In this way, calibration errors caused by asynchronization between the low frequency clock and the high frequency clock may be reduced. In addition, it may be ensured that when the system enters the sleep state after the clock is calibrated, the frequency deviation of the low frequency clock, where the frequency deviation of the low frequency clock is caused by the temperature change, does not exceed the maximum frequency deviation allowed by the system, which prevents failure of reception of network signals by a terminal.

Persons of ordinary skill in the art may understand that processes that implement the method provided in the foregoing embodiments may be implemented by a program instructing relevant hardware. The program may be stored in a readable storage medium. When the program is executed, corresponding steps of the foregoing method are performed. The storage medium may be a read-only memory (ROM), a random-access memory (RAM), a magnetic disk, or an optical disk.

The foregoing descriptions are merely exemplary embodiments of the present invention. It should be noted that persons of ordinary skill in the art may further make various improvements and refinements without departing from the principle of the present invention. All such modifications and refinements are intended to be covered by the present invention.

What is claimed is:

1. A method for calibrating a low frequency clock, comprising:
    calculating a frequency of a low frequency clock in a current low frequency clock calibration;
    calculating an average value of low frequency clock frequencies in n low frequency clock calibrations before the current low frequency clock calibration, wherein n is greater than 1 and is an integer;
    judging whether a difference between the frequency of the low frequency clock in the current low frequency clock calibration and the average value is smaller than a preset threshold for the difference; and
    calculating the number of sleep cycles according to the calculated and obtained frequency of the low frequency clock in the current low frequency clock calibration when the difference between the frequency of the low frequency clock in the current low frequency clock calibration and the average value is smaller than the preset threshold for the difference.

2. The method according to claim 1, further comprising returning to the calculation step and re-performing a low frequency clock calibration when it is judged that the difference between the frequency of the low frequency clock in the current low frequency clock calibration and the average value is not smaller than the preset threshold for the difference.

3. The method according to claim 1, wherein calculating the frequency of the low frequency clock in the current low frequency clock calibration comprises:
    starting a low frequency clock counter and a high frequency clock counter;
    determining the number M of high frequency clock cycles corresponding to preset N low frequency clock cycles;
    calculating a ratio of the number of low frequency clock cycles N to the number of high frequency clock cycles M; and
    using the ratio as the frequency of the low frequency clock in the current low frequency clock calibration, wherein N and M are integers greater than 1.

4. An apparatus for calibrating a low frequency clock, comprising:
    a first calculating unit configured to calculate a frequency of a low frequency clock in a current low frequency clock calibration and calculate an average value of low frequency clock frequencies in n clock calibrations before the current low frequency clock calibration, wherein n is greater than 1 and is an integer;
    a judging unit configured to judge whether a difference between the frequency of the low frequency clock in the current low frequency clock calibration and the average value is smaller than a preset threshold for the difference; and
    a second calculating unit configured to calculate the number of sleep cycles according to the calculated and obtained frequency of the low frequency clock in the current low frequency clock calibration when the difference between the frequency of the low frequency clock in the current low frequency clock calibration and the average value is smaller than the preset threshold for the difference.

5. The apparatus according to claim 4, further comprising a processing unit configured to control the calculating units to restart a low frequency clock calibration when it is judged that the difference between the frequency of the low frequency clock in the current low frequency clock calibration and the average value is not smaller than the preset threshold for the difference.

6. The apparatus according to claim 4, wherein the first calculating unit comprises:
- a starting subunit configured to start a low frequency clock counter and a high frequency clock counter;
- a determining subunit configured to determine the number M of high frequency clock cycles corresponding to preset N low frequency clock cycles;
- a first calculating subunit configured to calculate a ratio of the number of low frequency clock cycles N to the number of high frequency clock cycles M, and use the ratio as the frequency of the low frequency clock in the current low frequency clock calibration, wherein N and M are integers greater than 1; and
- a second calculating subunit configured to calculate an average value of low frequency clock frequencies in preset n low frequency clock calibrations before the current low frequency clock calibration, wherein n is greater than 1 and is an integer.

7. The apparatus according to claim 5, wherein the first calculating unit comprises:
- a starting subunit configured to start a low frequency clock counter and a high frequency clock counter;
- a determining subunit configured to determine the number M of high frequency clock cycles corresponding to preset N low frequency clock cycles;
- a first calculating subunit configured to calculate a ratio of the number of low frequency clock cycles N to the number of high frequency clock cycles M, and use the ratio as the frequency of the low frequency clock in the current low frequency clock calibration, wherein N and M are integers greater than 1; and
- a second calculating subunit configured to calculate an average value of low frequency clock frequencies in preset n low frequency clock calibrations before the current low frequency clock calibration, wherein n is greater than 1 and is an integer.

* * * * *